United States Patent [19]

LeTourneau

[11] 4,223,760

[45] Sep. 23, 1980

[54] LOUDSPEAKER ASSEMBLY

[76] Inventor: Ted L. LeTourneau, P.O. Box 7655, Longview, Tex. 75602

[21] Appl. No.: 898,717

[22] Filed: Apr. 24, 1978

[51] Int. Cl.[3] .................... H05K 5/00

[52] U.S. Cl. .................... 181/147; 181/153; 181/199

[58] Field of Search .................... 181/144–148, 181/150, 151, 153, 199; 179/1 E; D14/33

[56] References Cited

U.S. PATENT DOCUMENTS

| | | | |
|---|---|---|---|
| D. 215,449 | 9/1969 | Kaminski | D14/33 |
| D. 220,629 | 5/1971 | Shimizu | D14/33 |
| D. 228,920 | 10/1973 | Iida | D14/33 |
| D. 230,997 | 3/1974 | Shannon | D14/33 |
| 3,443,660 | 5/1969 | Virva et al. | 179/1 E |
| 3,637,039 | 1/1972 | Raichel et al. | 181/146 |
| 3,812,301 | 5/1974 | Lahti | 181/153 |
| 3,818,138 | 6/1974 | Sperrazza, Jr. | 179/1 E |
| 3,894,612 | 7/1975 | Maeda et al. | 181/199 |
| 3,978,941 | 9/1976 | Siebert | 181/153 |

OTHER PUBLICATIONS

Olson, Harry F., "Direct Radiator Loudspeaker Enclosures", Audio Engineering, vol. 35, Issue 11, 11–1951, pp. 34, 36, 38, 59–64.

*Primary Examiner*—L. T. Hix

*Assistant Examiner*—Benjamin R Fuller

*Attorney, Agent, or Firm*—Wm. T. Wofford

[57] ABSTRACT

An improved loudspeaker assembly wherein one or more speakers are mounted in a closed cylindrical housing of air impervious material. When a plurality of speakers are utilized in an assembly, they are vertically spaced, with the central axis of each speaker contained in a respective radial plane and with adjacent radial planes having an included angle typically within the range of 15° to 25°. A preferred material for the cylindrical housing is laminated fibreboard.

8 Claims, 3 Drawing Figures

LOUDSPEAKER ASSEMBLY

FIELD OF THE INVENTION

This invention pertains to loudspeaker assemblies and more particularly to improved structure and arrangement for such assemblies.

BACKGROUND OF THE INVENTION

There is a need for a loudspeaker assembly which can accommodate a plurality of speakers in such a manner as to provide desirable distribution of sounds at the higher end of the frequency range while providing better concentration of sounds at the lower end of the frequency range; which has a closed baffle configuration; and which is at the same time lightweight, compact, easily movable, structurally rugged, and economical to manufacture. There is also a need for a loudspeaker assembly which can accommodate one or more speakers; which has a closed baffle configuration; and which is at the same time lightweight, compact, easily movable, structurally rugged, and economical to manufacture. These needs are not satisfied by any prior art speaker assemblies of which I am aware.

It is accordingly the object of my invention to provide improved speaker assemblies which satisfy the needs as above stated.

For a further understanding of the invention and further objects, features, and advantages thereof, reference may now be had to the following description taken in conjunction with the accompanying drawing.

DESCRIPTION OF PREFERRED EMBODIMENTS

Figure 1:
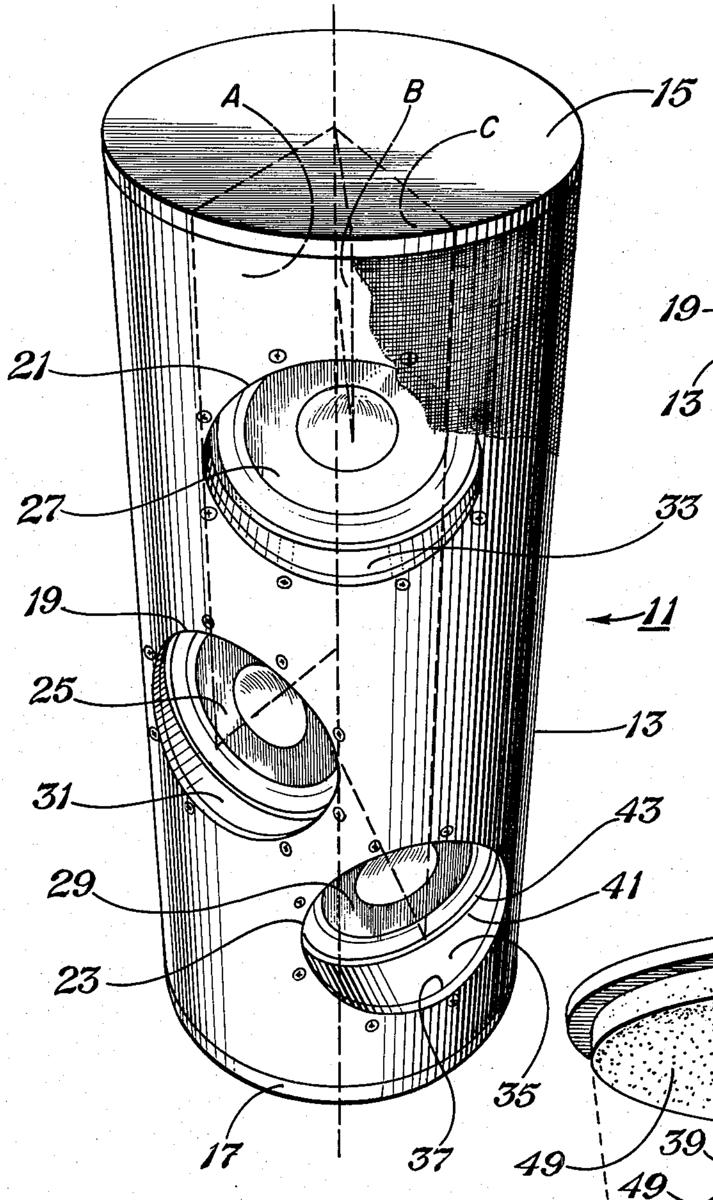
FIG. 1 is a schematic perspective view showing an improved speaker assembly in accordance with a preferred embodiment of the invention.
Figure 2:
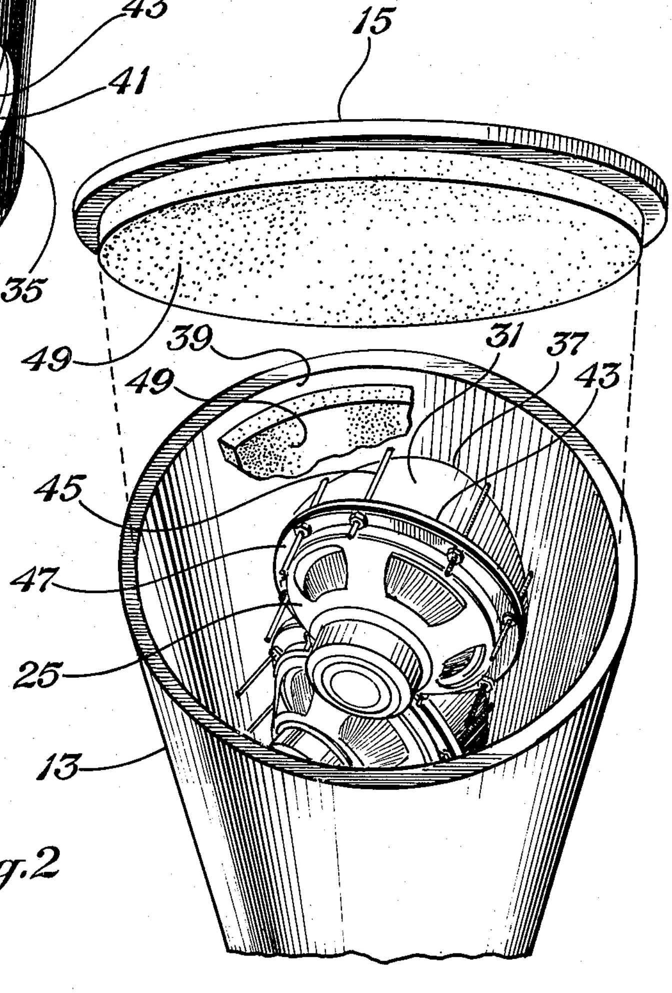
FIG. 2 is a schematic fragmentary perspective view, partially exploded, showing the upper interior portion of the speaker assembly of FIG. 1.

Referring now to FIGS. 1 and 2 of the drawing, there is shown a loudspeaker assembly including a housing 11 having a cylindrical body 13 and top and bottom end closures 15, 17.

The housing 11 is provided three vertically spaced openings 19, 21, 23, one for each of three speakers 25, 27, 29, which in the embodiment shown, have circular peripheral outlines. These openings each have a central axis (not shown) which is contained in a respective radial plane A, B, C (indicated by dotted lines in FIG. 1). The central axis of the first opening 19 is contained in first radial plane A, while the central axis of the second opening 21 is contained in second radial plane B, and the central axis of the third opening 23 is contained in third radial plane C. Adjacent radial planes (A, B and B, C) having an included angle typically within the range of 15° to 25°.

A respective filler element 31, 33, 35 surrounds the periphery of each opening 19, 21, 23 and extends inwardly therefrom. Each filler element 31, 33, 35, in the embodiment shown, has a circular transverse section shape, with an inside diameter that is substantially equal to the diameter of a respective opening 19, 21, 23, so that the filler element surrounds the periphery of the respective opening. Each filler element 31, 33, 35 has a front face 37 that is contoured so as to contiguously abut the inner surface 39 of the body surrounding a respective opening 19, 21, 23. Each filler element further has a planar rear face 41.

Each speaker 25, 27, 29 is disposed with its mounting surface or peripheral front surface 43 abutting the rear face 41 of a respective filler element. In the embodiment shown, each speaker 25, 27, 29 is secured to the cylindrical body 13 by bolts 45. The bolts 45 have countersunk, flat heads and pass through holes disposed about the opening periphery and extend through holes in the speaker mounting flange 47. When the bolts 45 are tight, the respective filler element 31, 33, 35 is securely clamped between the speaker peripheral front surface 43 and the cylindrical inner surface 39. The end closures 15, 17 are secured to the cylindrical body by any suitable means such as adhesive or screws or nails (not shown). The inner surface 39 of the cylindrical body 13 and the inner surfaces of the end closures 15, 17 are lined with conventional sound deadening material 49.

In the embodiment shown by FIGS. 1 and 2, the material for the cylindrical body 13 may typically be laminated fibreboard, that is $\frac{1}{4}$ inch thick with a diameter of about 12 inches and a length of about 30 inches; the end closures 15, 17 may be of plywood $\frac{1}{2}$ inch thick, and the speakers 25, 27, 29 may be an 8 inch size.

I have found that it is advantageous to use commercially available cylindrical laminated fibreboard stock to make the cylindrical body 13 and the filler elements 31, 33, 35. Such cylindrical laminated fibreboard stock is commonly used for tubular concrete forms, carpet roll centers, container bodies, and the like.

If four speakers were used, the fourth speaker would have its central axis in a fourth radial plane. If five speakers were used, the fifth speaker would have its central axis in a fifth radial plane. If six speakers were used, the sixth speaker may have its central axis in a sixth radial plane or alternatively, three pairs of two speakers may have their central axes in three radial planes. Only two speakers could be used if desired, although this is not preferable. The chosen angle between adjacent radial planes will depend on the total angle of the field to be covered by the speaker assembly and the number of speakers used as well as the desired high frequency distribution pattern. The vertical distance between speakers is chosen so as to be non-harmonic in order to provide for a smooth response in the lower frequency range.

If speakers having peripheral shapes other than circular are used, then the cylindrical body openings and the filler elements would be correspondingly shaped.

Figure 3:
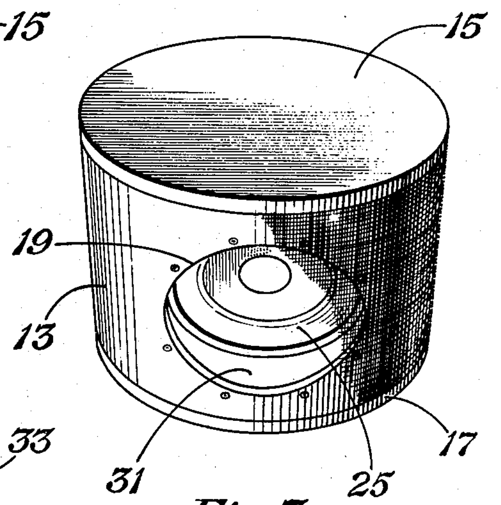
FIG. 3 is a schematic perspective view showing an improved speaker assembly utilizing a single speaker.

I have found that by making the speaker housing cylindrical, it is possible to have an effectively closed baffle arrangement with requisite structural rigidity but without requiring use of heavy and massive materials. This is true whether a plurality of speakers is utilized, as shown by FIGS. 1 and 2, or only a single speaker is utilized, as shown by FIG. 3. The material used, speaker size, dimensions, and structure for the single speaker embodiment of FIG. 3 may typically be the same as for the embodiment of FIGS. 1 and 2 except that the length of the cylindrical body 13 would be about 10 inches.

I have found further that when the speakers are vertically spaced, with their central axes disposed in various radial planes, as hereinabove described, a compact and easily handled structure results. With the speaker central axes disposed in the various radial planes as hereinabove described, there is a better distribution of sounds at the higher end of the frequency range and a better concentration of sounds at the lower end of the frequency range. In addition, particularly when cylindrical laminated fibreboard stock is utilized, the improved speaker assemblies embodying the present invention are economical to manufacture.

The foregoing disclosure and the showings made in the drawings are merely illustrative of the principles of this invention and are not to be interpreted in a limiting sense.

What is claimed is:

1. A loudspeaker assembly comprising:
a. at least three speakers, each being substantially the same size and having a peripheral front surface;
b. a housing having a cylindrical body and end closures:
c. said cylindrical body having at least three vertically spaced openings therein, with each said opening sized and shaped to correspond with the peripheral outline of a respective said speaker, with the central axis of a first said opening being contained in a first radial plane, with the central axis of a second said opening being contained in a second radial plane, with the central axis of a third said opening being contained in a third radial plane, and with the angle between adjacent said radial planes being less than the angle between two radial planes that are respectively tangent to the peripheral edges of a said opening;
d. a respective filler element surrounding the periphery of each said opening and extending inwardly therefrom and having a front face contoured to contiguously abut said body and a planar rear face;
e. means mounting and securing each speaker with its peripheral front surface abutting the planar rear face of a respective filler element;
f. said cylindrical body, end closures and filler elements being made of material that is impervious to air.

2. The device of claim 1 wherein said cylindrical body is made of cylindrical laminated fibreboard stock.

3. The device of claim 2 wherein said speakers are circular in shape and said filler elements are made of cylindrical laminated fibreboard stock.

4. The device of claim 1 wherein the vertical distance between speakers is non-harmonic.

5. A loudspeaker assembly comprising:
a. a plurality of speakers, each being substantially the same size and having a peripheral front surface;
b. a housing having a cylindrical body and end closures;
c. said cylindrical body having an opening therein for each said speaker with each opening being vertically spaced from any adjacent opening, with each said opening sized and shaped to correspond with the peripheral outline of a respective said speaker, with the central axis of a first said opening being contained in a first radial plane, with the central axis of a second said opening being contained in a second radial plane, with the central axes of successive said openings being contained in respective successive radial planes, and with the angle between adjacent said radial planes being less than the angle between two radial planes that are respectively tangent to the peripheral edges of a said opening;
d. a respective filler element surrounding the periphery of each said opening and extending inwardly therefrom and having a front face contoured to contiguously abut said body and a planar rear face;
e. means mounting and securing each speaker with its peripheral front surface abutting the planar rear face of a respective filler element;
f. said cylindrical body, end closures and filler elements being made of material that is impervious to air.

6. The device of claim 5 wherein said cylindrical body is made of cylindrical laminated fibreboard stock.

7. The device of claim 6 wherein said speakers are circular in shape and said filler elements are made of cylindrical laminated fibreboard stock.

8. The device of claim 5 wherein the vertical distance between speakers is non-harmonic.

* * * * *